(12) United States Patent
Stauf et al.

(10) Patent No.: US 6,599,447 B2
(45) Date of Patent: Jul. 29, 2003

(54) ZIRCONIUM-DOPED BST MATERIALS AND MOCVD PROCESS FORMING SAME

(75) Inventors: Gregory T. Stauf, New Milford, CT (US); Philip S. Chen, Bethel, CT (US); Jeffrey F. Roeder, Brookfield, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/726,183

(22) Filed: Nov. 29, 2000

(65) Prior Publication Data

US 2002/0103087 A1 Aug. 1, 2002

(51) Int. Cl.$^7$ ............................. H01B 1/08; C04B 35/48

(52) U.S. Cl. .................. 252/520.21; 501/138; 501/139

(58) Field of Search ..................... 252/520.21; 501/138, 501/139

(56) References Cited

U.S. PATENT DOCUMENTS

| | | | |
|---|---|---|---|
| 5,486,491 A | 1/1996 | Sengupta et al. | |
| 5,972,430 A | 10/1999 | DiMeo, Jr. et al. | |
| 6,110,529 A | 8/2000 | Gardiner | |
| 6,139,780 A | * 10/2000 | Desu et al. | ............ 252/584 |

OTHER PUBLICATIONS

Stauf et al "Properties of Zr–substituted (Ba,Sr)TiO3 thin films . . .", Materials Research Society Symposium Proceedings (2000), 603 (Materials Issues for Tunable RF and Microwave Devices), 131–136.*

Byun et al "Characterization of (Ba0.65Sr0.35)(Ti0.65Zr0.35)O3 thin film" Materials Research Bulletin 35 (2000) (Aug.) pp. 1755–1761.*

Park et al "Effects of chamber pressure on composition and electrical properties of Zr–modified (Ba1–x, Srx)TiO3 thin films grown by sputtering", JJAP, Part 2: Letters (2000), 39(11B), L1177–L1179 (Abstract Only).*

Kim et al "The zirconium doped (Ba0.65Sr0.35)(ti1–Zrx)O3 thin films for Gbit–scale dynamic random acess memory device applications", Integrated Ferroelectrics (1999), 24(1–4), 65–74.*

Jpn. J. Appl. Phys., vol. 39, (2000) L1177–L1179, Part 2, No. 11B, Nov. 15, 2000, "Effects of Chamber Pressure on Composition and Electrical Properties of Zr–Modified (Ba1–x, Srx)TiO3 Thin Films Grown by Sputtering" Sang–Shik Park and Soon–Gil Yoon1.

Byun, et al. "Characterization of (Ba0.65Sr0.35)(Ti0.65Zr0.35)O3 thin film", Materials Research Bulletin 35 (Aug. 2000) 1755–1761, See attached abstract, Figure 5 & 6.

(List continued on next page.)

Primary Examiner—Mark Kopec
(74) Attorney, Agent, or Firm—Margaret Chappuis; Steven J. Hultquist (57) ABSTRACT

A Zr-doped $(Ba,Sr)TiO_3$ perovskite crystal material dielectric thin film. Such dielectric thin film is characterized by at least one of the characteristics including: (a) a breakdown strength of at least 1.3 MV/cm; (b) a leakage current of not more than $1\times10^{-3}$ A/cm$^2$ under applied voltage of about ±3V or above and at temperature of about 100° C. or above; and (c) an energy storage density of at least 15 J/cc. The dielectric thin film comprises zirconium dopant in the amount of 0.5% to 50% by total weight of the Zr-doped $(Ba,Sr)TiO_3$ perovskite crystal material, preferably 2–15%, more preferably 4% to 14%, and most preferably 5% to 12%. Such dielectric thin film in a preferred aspect is deposited by a MOCVD process using metal precursors Ba(thd)$_2$-polyamine, Sr(thd)$_2$-polyamine, Zr(thd)$_4$, and Ti(OiPr)$_2$(thd)$_2$ at a deposition temperature in the range from about 560° C. to 700° C.

35 Claims, 11 Drawing Sheets

OTHER PUBLICATIONS

Kim, et al. "The Zirconium Doped (Ba0.65Sr0.35)(Ti1–xZrx)O3 thin films for Bbit–scale dynamic randon acess memory device applications", Integrated Ferroelectrics, 1999, vol. 24, 65–74, see Abstract; Fig. 6.

Stauf, et al., "Properties of Zr–substituted (Ba, Sr)TiO3 thin films for integrated capacitors". Material Research Society Symposium Proceedings (2000), 603, 131–136.

* cited by examiner

ZIRCONIUM-DOPED BST MATERIALS AND MOCVD PROCESS FORMING SAME

GOVERNMENT RIGHTS IN INVENTION

The invention disclosed herein was made in the performance of United States Air Force Contract No. F33615-98-C-2850 (High Temperature Integrated Capacitors) and DARPA Contract No. F33615-98-C-5411 (Tunable Ferroelectric Thin Film Varactor). The United States Government has rights in such invention.

BACKGROUND OF THE INVENTION

1. Field of the Invention

The present invention relates to metalorganic chemical vapor deposition (MOCVD) formation of $(Ba,Sr)(Zr,Ti)O_3$ perovskite crystal thin films of high breakdown strength, low leakage, low loss tangent, high permittivity, and substantial tunability with application of electric fields. Such $(Ba,Sr)(Zr,Ti)O_3$ thin films can be used to manufacture dielectric capacitors or other related microelectronic devices of significantly improved performance useful in many applications, especially for use under elevated temperature and/or high frequency.

2. Description of the Related Art

A wide variety of semiconductor materials is used in integrated circuitry for electronic devices. Increasingly more compact integrated circuits with greater capacities are required for new devices, as well as existing device applications. This in turn necessitates the use of materials with higher specific capacitance in order to further reduce the size of individual transistors and capacitors in such integrated circuitry.

Ferroelectric materials typically have high specific capacitance due to their high permittivity $\in$, which usually ranges from about 200 to about 500, making these materials correspondingly attractive as dielectric materials for capacitors. Conventional ferroelectric materials used in integrated circuit applications include ferroelectric dielectric compounds of perovskite crystalline structure, such as $Pb(Zr,Ti)O_3$ (PZT), $BaTiO_3$ (BT), and $(Ba,Sr)TiO_3$ (BST).

Despite their advantages and favorable characteristics, these conventional ferroelectric materials have an associated disadvantage of relatively low breakdown strength. As a result, dielectric devices made from these materials can fail catastrophically when applied voltage rises above a specific level and causes strong short-circuit currents. In order to avoid system failure incident to such short-circuiting, applied voltage on the dielectric devices made from these materials has to be controlled carefully to keep the applied voltage below the breakdown limit. Since energy storage capacity of a capacitor positively correlates with the square of applied voltage on such capacitor, limitations on applied voltage correspondingly limit the electrical energy storage characteristics of the capacitor.

Further, conventional ferroelectric materials exhibit high current leakage under elevated voltage conditions. This in turn leads to high power dissipation as evidenced by high loss tangent δ of the material. The high power dissipation rate greatly reduces the energy storage efficiency of corresponding dielectric devices fabricated from such conventional ferroelectric materials.

In contrast, many linear dielectric materials, such as $SiO_2$ and $Ta_2O_5$, exhibit high breakdown strength. Unfortunately, the permittivity of these materials is very low, usually in the range from 3 to 20. Such low permittivity results in unsatisfactorily low specific capacitance of these dielectric materials, rendering them unsuitable for energy storage applications in integrated circuit devices.

Accordingly, there exists a compelling need for improved dielectric materials with both high specific capacitance and high breakdown strength, as well as low current leakage and low loss tangent. Dielectric materials having such combination of properties would enable manufacture of microcapacitors or other micro-electronic devices with substantially improved energy storage and operating characteristics, relative to currently used materials.

SUMMARY OF THE INVENTION

The present invention relates in one aspect to an improved dielectric thin film comprising modified $(Ba,Sr)TiO_3$ (BST) perovskite crystal material doped with zirconium, and to devices comprising same.

As used herein, the term "thin film" refers to a film having a thickness of less than 20,000 Å.

Devices utilizing dielectric Zr-doped BST perovskite crystal material within the broad scope of the present invention include, but are not limited to: electroluminescent displays (ELDs); pulse discharge capacitors; high frequency devices operated under a frequency of at least 5 MHz, more preferably in a range from 10 MHz to 40 GHz; dynamic random access memory cells (DRAMs) and ferroelectric random access memory cells (FeRAMs); microwave phase shifting and tunable varactors (variable capacitors); piezoelectric actuating elements; passive as well as active microelectromechanical system (MEMS) devices; optical devices, including both geometric and spectral- or interference-based devices, such as movable microlens arrays or movable micromirror arrays; spectral devices to alter a resonant cavity in an etalon structure to detune the reflectance of the device; micropumps and microvalves based on piezoelectric film cantilever structures, e.g., for applications such as medication dose delivery systems, or operation of hydraulic or fluidic systems in a MEMS apparatus; ultrasonic transducers, e.g., for high frequency flaw detection systems; vibration control devices; dfribillators; gate dielectrics; uncooled infrared radiation pyroelectric detectors; EEPROM and flash memory replacements; etc.

In a specific aspect, the present invention relates to a Zr-doped BST perovskite crystal material thin film formed by a MOCVD process, having high permittivity, high breakdown strength, low leakage, high-energy storage density, and high dielectric constant tunability. Such Zr-doped BST perovskite crystal material thin film in one particular aspect is characterized by at least one of the following improved dielectric properties:

- a breakdown strength of at least 1.3 MV/cm, more preferably at least 1.5 MV/cm;
- a leakage current of not more than $1\times10^{-3}$ A/cm$^2$ under applied voltage of about ±3V or above and at temperature of about 100° C. or above, more preferably not more than $1\times10^{-4}$ A/cm$^2$, and most preferably not more than $1\times10^{-5}$ A/cm$^2$, under the same applied voltage and temperature conditions; and
- an energy storage density, based on volume of dielectric, of at least 15 J/cc, more preferably at least 20 J/cc, and most preferably at least 25 J/cc.

Another specific compositional aspect of the present invention relates to Zr-doped BST perovskite crystal material thin film comprising 0.5% to 50% Zr by total weight of such perovskite crystal material, preferably 2% to 15%, more preferably 4% to 14%, and most preferably 5% to 12%.

High quality thin films with low defect density tend to exhibit superior breakdown strength compared to analogous bulk material. The Zr-doped BST perovskite crystal material thin film of the present invention in a preferred embodiment has a thickness in one of the following ranges: from 150 Å to 10,000 Å; from 150 Å to 5000 Å; from 150 Å to 2500 Å; or from 150 Å to 1000 Å. More preferably such Zr-doped BST perovskite crystal material thin film is about 300 Å to about 700 Å thick, e.g., about 500 Å thick.

Growth temperature of a perovskite crystal material thin film deposited by MOCVD process has a significant impact upon crystalline structure of the thin film that is deposited, which consequently affects dielectric properties of such thin film. Carrying out the MOCVD deposition process under lower growth temperature (e.g., in a range of from about 540° C. to about 560° C.) tends to form films of amorphous or microcrystalline structure, which have relatively lower permittivity and energy storage capacity.

By contrast, carrying out the deposition process under higher growth temperatures (e.g., 600° C.) significantly enhances crystal grain growth, resulting in larger crystal grains with generally longer range order and better aligned crystal lattice structure and correspondingly higher permittivity and energy storage capacity. When the growth temperature is about 660° C., the deposited thin film becomes primarily <110> oriented with the most preferred crystalline structure and dielectric properties.

Thus, a preferred embodiment of the present application relates to a Zr-doped BST perovskite crystal thin film fabricated by an MOCVD process comprising a film growth temperature (deposition temperature) in the range from about 560° C. to about 700° C., e.g., above about 600° C., and more preferably from about 600° C. to about 680° C. A particularly preferred growth temperature for the MOCVD process of the present invention is about 660° C.±20° C., whereby the Zr-doped BST perovskite crystal thin film formed in the process is high quality, single phase crystalline material that is substantially free of second phase formation.

Such high quality Zr-doped BST perovskite crystal thin film, containing zirconium dopant at the previously described dopant concentration levels, advantageously retains the high permittivity and high dielectric constant that are characteristic of undoped BST crystal materials. Specifically, Zr-doped BST perovskite crystal thin films of the present invention, when deposited at a growth temperature of 660° C. with Zr content in the range from 2% to 15% by total weight of such crystal thin film, retain a high permittivity of at least 200. More preferably, the Zr-doped BST perovskite crystal thin film has a permittivity of at least 250, and most preferably, such crystal thin film has a permittivity of at least 300.

Conventional undoped BST material has high tunability, which means that its dielectric constant shifts with applied voltage or frequency and therefore becomes "tunable" under changing voltage or frequency conditions. This characteristic is advantageously employed in various phase shifting applications, including microwave phase shifting and tunable varactor applications. However, the conventional BST material, due to its large loss tangents, tends to dissipate electronic energy at a high rate with consequent high energy wastage. When applied voltage increases to above ±4V or an electric field above approximately 800 kV/cm, the loss tangent of the conventional BST material soars to as high as 0.8. Additionally, the loss tangent of the conventional BST material significantly increases at low and high frequencies.

A further aspect of the present invention therefore relates to a Zr-doped BST crystal thin film with improved electronic properties that is particularly suitable for use in microwave phase shifting and tunable varactor applications. The Zr-doped BST crystal thin film of such preferred embodiment, as modified by the B-site modifier zirconium, exhibits a reduced loss tangent of not more than 0.2 under applied voltage in the range from −4V to +4V or an electric field in the range from about −800 kV/cm to +800 kV/cm, with a comparable or enhanced tunability ratio of not less than 2.5:1. The Zr-doped BST crystal thin film in such embodiment also has a reduced loss tangent of not more than 0.02 under applied frequency in the range from 10 kHz to 100 kHz.

Another aspect of the present invention relates to an MOCVD process for fabricating a dielectric thin film comprising $(Ba,Sr)TiO_3$ perovskite crystal doped with zirconium, comprising:

preparing metal precursor liquid compositions comprising Ba, Sr, Ti, and Zr metal precursors separately or as mixtures;

flash vaporizing the liquid metal precursor compositions at a vaporization temperature in the range from about 100° C. to about 300° C.;

transporting the vaporized metal precursor compositions with a carrier gas into a chemical vapor deposition chamber containing a heated substrate; and depositing the vaporized metal precursor compositions onto the heated substrate in the chemical vapor deposition chamber in the presence of an oxidizing co-reactant gas to form the dielectric thin film comprising $(Ba,Sr)TiO_3$ perovskite crystal material doped with zirconium;

wherein the dielectric material thin film has at least one characteristic selected from the group consisting of:

(a) a breakdown strength of at least 1.3 MV/cm;

(b) a leakage current of not more than $1\times10^{-3}$ A/cm$^2$ under applied voltage of about ±3V or above and at temperature of about 100° C. or above; and (c) an energy storage density of at least 15 J/cc.

Such MOCVD process utilizes a unique, compatible set of metalorganic precursors under specific process conditions to achieve precise compositional and microstructural control.

Such metalorganic precursors comprise Ba, Sr, Ti, and Zr metal coordination complexes including at least one ligand selected from the group consisting of β-diketonates, β-ketoiminates, β-diiminates, $C_1$–$C_8$ alkyl, $C_2$–$C_{10}$ alkenyl, $C_2$–$C_{15}$ cycloalkenyl, $C_6$–$C_{10}$ aryl, $C_1$–$C_8$ alkoxy, and fluorinated derivatives thereof.

Metalorganic precursors including at least one ligand as above-listed are stabilized in character, meaning that the metalorganic precursors are resistant to degradation induced by ligand exchange reactions, e.g., non-degenerative ligand exchanges which adversely affect the chemical identity and suitability of the reagent compositions for MOCVD applications.

The Ba, Sr, Ti, Zr metal precursors may also be dissolved in a solvent to facilitate liquid delivery of such metal precursors. The solvent utilized for delivering the metal precursors may comprise any suitable solvent species, or combination of solvent species, with which the metal precursors are compatible, such as glymes, aliphatic hydrocarbons, aromatic hydrocarbons, ethers, esters, alkyl nitrites, alkanols, amines, and polyamines.

More preferably, the carrier solvent used in the practice of the present invention comprises tetrahydrofuran, alkyl acetate, tetraglyme, polyamines, or $C_3$–$C_8$ alkanols. A most preferred solvent composition useful for the purpose of delivering Ba, Sr, Ti, and Zr metal precursors comprises both butyl acetate and polyamines.

U.S. Pat. No. 5,820,664 "Precursor Compositions for Chemical Vapor Deposition, and Ligand Exchange Resistant Metal-Organic Precursor Solutions Comprising Same" issued to Gardiner et al. on Oct. 13, 1998, and U.S. Pat. No. 6,110,529 "Method of Forming Metal Films on a Substrate by Chemical Vapor Deposition" issued Aug. 29, 2000 to Robin Gardiner, are incorporated by reference herein. These patents contain detailed disclosure regarding metalorganic precursors and solvents for delivering such precursors, such as are useful in the broad practice of the present invention.

In a preferred embodiment of the present invention, the MOCVD process uses a strontium or barium metal precursor such as Sr bis(thd) or Ba bis(thd) coordinated with a Lewis base, e.g., a Lewis base selected from the group consisting of alkene, dierie, cycloalkene, cyclooctatetraene, alkyne, substituted alkyne (symmetrical or asymmetrical), amine, diamine, triamine, tetraamine, polyamine, ether, diglyme, triglyme, tetraglyme, tetramethyl, dialkyl sulfide, ethylenediamine, vinyltrimethylsilane, allyltrimethylsilane, and pentaamethyl diethylenetriamine. A particularly preferred Lewis base coordinating with such Sr bis(thd) or Ba bis(thd) comprises a polyamine.

Any suitable titanium or zirconium metalorganic compounds with sufficient volatility to be decomposed in the chemical vapor deposition chamber under a desirable growth temperature can be used. Specifically, the metal precursor liquid compositions of the present invention may comprise $Zr(thd)_4$, $Zr(OiPr)_2(thd)_2$, $Zr(OtBu)_2(thd)_2$, $Ti(thd)_4$, $Ti(OiPr)_2(thd)_2$, $Ti(OtBu)_2(thd)_2$, and combinations thereof, wherein "thd" denotes the ligand 2,2,6,6-tetramethyl-3,5-heptanedionato, "OiPr" denotes isopropoxide (—$OCH(CH_3)_2$), and "OtBu" denotes tert-butoxy (—$OC(CH_3)_3$).

Metalorganic compounds most preferred as metal precursors for forming $(Ba,Sr)(Ti,Zr)O_3$ perovskite crystal thin films in the present MOCVD process include $Ba(thd)_2$-polyamine, $Sr(thd)_2$-polyamine, $Zr(thd)_4$, and $Ti(OiPr)_2(thd)_2$.

A specific aspect of the present invention relates to a MOCVD process for depositing Zr-doped BST perovskite crystal thin film under a film growth temperature in the range from about 500° C. to about 750° C., more preferably from about 560° C. to about 700° C., and even more preferably from about 600° C. to about 680° C. The most preferred growth temperature for the MOCVD process of the present invention is about 660° C.±20° C., whereby the product Zr-doped BST perovskite crystal thin film is a high quality, single phase crystalline film that is substantially free of second phase formation.

Such MOCVD process for depositing Zr-doped BST perovskite crystal thin film is generally carried out under a deposition pressure in the range from about 700 millitorr to about 750 millitorr, and the Zr-doped BST perovskite crystal thin film is formed on the heated substrate at a growth rate in the range of from about 10 Å/min to 60 Å/min.

Preferably, the carrier gas employed in the practice of the present invention for transporting the vaporized metal precursor compositions into the chemical vapor deposition chamber includes, but is not limited to, argon or other inert gas. Such carrier gas may be introduced for mixing with vaporized metal precursor compositions at a suitable flow rate, e.g., of about 200 sccm.

Oxidizing co-reactant gases useful for the broad practice of the present invention include, but are not limited to, $O_2$, $N_2O$, and $O_3$. More preferably, the oxidizing co-reactant gases used in the MOCVD process of the present invention include $O_2$ and $N_2O$, and both gases are introduced into the chemical vapor deposition chamber at a suitable flow rate, e.g., of about 500 sccm.

In a preferred aspect, to achieve effective compositional control, the MOCVD process of the present invention delivers metal precursors into the chemical vapor deposition chamber for deposition reaction as follows:

| Metal Precursor | Delivery Rate |
| --- | --- |
| $Ba(thd)_2$-polyamine | 5–30 μmol/min |
| $Sr(thd)_2$-polyamine | 5–30 μmol/min |
| $Zr(thd)_4$ | 10–20 μmol/min |
| $Ti(OiPr)_2(thd)_2$ | 10–20 μmol/min |

Another aspect of the present relates to a digital MOCVD process for fabricating the (Ba, Sr) $TiO_3$ perovskite crystal thin film doped with zirconium, including the steps of:

(i) providing a chemical vapor deposition chamber with a substrate therein;

(ii) forming over the substrate a multi-component metal precursor layer, using two or more metal precursors introduced simultaneously into the chemical vapor deposition chamber, in absence of an oxidant reactant; and (iii) oxidizing such multi-component metal precursor layer to form the dielectric thin film comprising (Ba, Sr)$TiO_3$ perovskite crystal material doped with zirconium, using an oxidant reactant introduced into the chemical vapor deposition chamber, in absence of the metal precursors, in which the dielectric thin film has at least one characteristic selected from the group consisting of:

(a) a breakdown strength of at least 1.3 MV/cm;

(b) a leakage current of not more than $1 \times 10^{-3}$ $A/cm^2$ under applied voltage of about ±3V or above and at temperature of about 100° C. or above; and (c) an energy storage density of at least 15 J/cc.

For more detailed disclosure of such digital MOCVD process, see U.S. Pat. No. 5,972,430 "Digital Chemical Vapor Deposition (CVD) Method For Forming a Multi-Component Oxide Layer" issued to DiMeo, Jr. et al. on Oct. 26, 1999, which is incorporated by reference herein.

Such digital MOCVD process may repeat steps (ii) and (iii) sequentially for a sufficient number of cycles to yield a dielectric thin film of desired thickness. Moreover, the substrate on which the dielectric thin film is deposited, may for example be a structural component of a microelectronics device or a sensor device.

Dielectric crystal thin films formed by such digital MOCVD process have improved electronic properties due to enhanced crystallinity of the films, improved uniformity and conformality upon a structured surface at comparatively lower deposition temperatures, enhanced precursor incorporation efficiency, and attenuated precursor phase reactions during deposition process.

Other aspects, features and embodiments of the present invention will become more fully apparent from the ensuing disclosure and appended claims.

DETAILED DESCRIPTION OF THE INVENTION AND PREFERRED EMBODIMENT THEREOF

The present invention provides improved BST perovskite crystal thin films suitable for manufacturing high performance microelectronic devices, as well as a commercially useful process for forming such thin films.

In bulk BST ceramic materials, the addition of zirconia significantly reduces loss tangent of the mixture of BST and zirconia. Sengupta et al. U.S. Pat. No. 5,486,491 (hereinafter "Sengupta") discloses a ceramic ferroelectric material with the general compositional formula $(Ba,Sr)TiO_3$—$ZrO_2$, prepared by obtaining powders of BST and zirconia, mixing such powders in a desired weight percentage, ball milling such mixture in an organic solvent with a binder, air-drying such mixture, dry-pressing and sintering the final mixture under high pressure and elevated temperature to obtain a bulk BST-zirconia ceramic (see Sengupta, column 4, lines 6–24). However, such bulk BST-zirconia ceramic contains BST and zirconia only as mixed microparticles, not as a single compound. Zirconium is not incorporated into the BST crystalline structure to replace titanium, as in the present invention. Consequently, such bulk BST-zirconia ceramic of Sengupta still has undesirably low breakdown strength (measured by the electric field such ceramic can withstand before catastrophic failure occurs) of less than 2 $V/\mu m$, which is about $2 \times 10^4$ V/cm (see Sengupta, column 4, Tables 2 and 3).

By contrast, the present invention employs MOCVD techniques to deposit a perovskite crystal thin film with a general compositional formula of $(Ba,Sr)(Zr,Ti)O_3$, wherein Zr is a B-site modifier that partially replaces Ti in the crystal lattice of the BST material. Zirconium in the present invention is fully incorporated into the BST crystalline structure as an isovalent substitutional cation to form a single-phase perovskite crystal thin film with significantly enhanced breakdown strength. Quantitatively, the breakdown strength of the Zr-doped BST perovskite crystal thin film of the present invention is at least 1.3 MV/cm, which is about $1.3 \times 10^6$ V/cm and is almost two orders of magnitude higher than the breakdown strength of the BST-zirconia ceramics disclosed by Sengupta.

Figure 1:
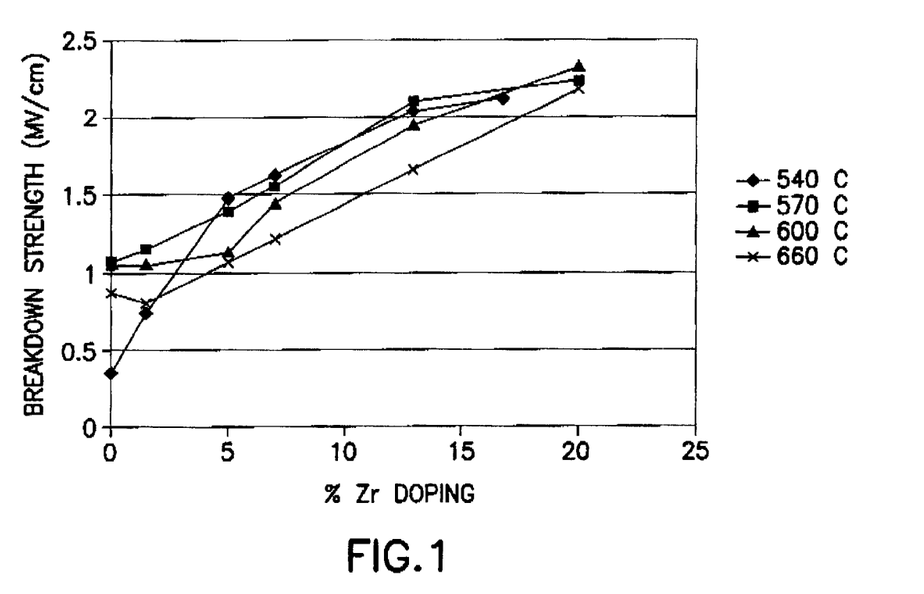
FIG. 1 shows breakdown strength (in MV/cm) of Zr-doped BST perovskite crystal thin films (500 Å) deposited at various growth temperatures, plotted as a function of Zr content in such films (in % by total weight of such films).

FIG. 1 shows breakdown strength of the Zr-doped BST perovskite crystal thin films of the present invention, having a thickness of approximately 500 Å, as a function of Zr content in such films, represented by % of Zr dopant incorporated in total weight of such films.

Such perovskite crystal thin films are deposited by MOCVD process under various growth temperatures as shown by FIG. 1. Breakdown strength of the Zr-doped BST perovskite crystal thin films decreases while growth temperature increases from 540° C. to 660° C., but only to a very minor extent.

Incremental increases in the Zr content significantly enhance breakdown strength of the Zr-doped BST thin films. When Zr content is increased to above 7% by weight, based on the total weight of the Zr-doped BST thin film, the breakdown strength of such films generally rises to above 1.3 MV/cm, regardless of the growth temperatures at which such films are deposited.

Maximum volumetric energy storage density of a dielectric material is positively correlated to its breakdown strength, which is the strongest electric field such dielectric material can stand before breaking down, and also to its permittivity. The following equation quantitatively describes the relationship between volumetric energy storage density, applied electric field, and permittivity of a dielectric material:

$$U = \tfrac{1}{2} \times \in \times F^2$$

wherein:
- U is volumetric energy storage density (in J/cc);
- ∈ is permittivity, which equals k×∈$_0$, wherein k is dielectric constant of the dielectric material, and ∈$_0$ is permittivity of free space, as arbitrarily set to be 1; and
- F refers to the electric field applied on the dielectric material.

When the electric field F increases, the volumetric energy storage density U increases quadratically. Although addition of Zr dopant into BST dielectrics will cause decrease in permittivity to a certain degree (as explained in more detail hereinafter), increase in breakdown strength (i.e. applicable electric field) caused by addition of Zr dopant has a much stronger effect on the volumetric energy storage density of the resultant Zr-doped BST dielectrics, and such increase in breakdown strength is more than sufficient to offset the negative effect of reduced permittivity. Therefore, the addition of Zr dopant will result in an overall increase in volumetric energy storage density U of the resultant Zr-doped BST dielectric materials.

Figure 2:
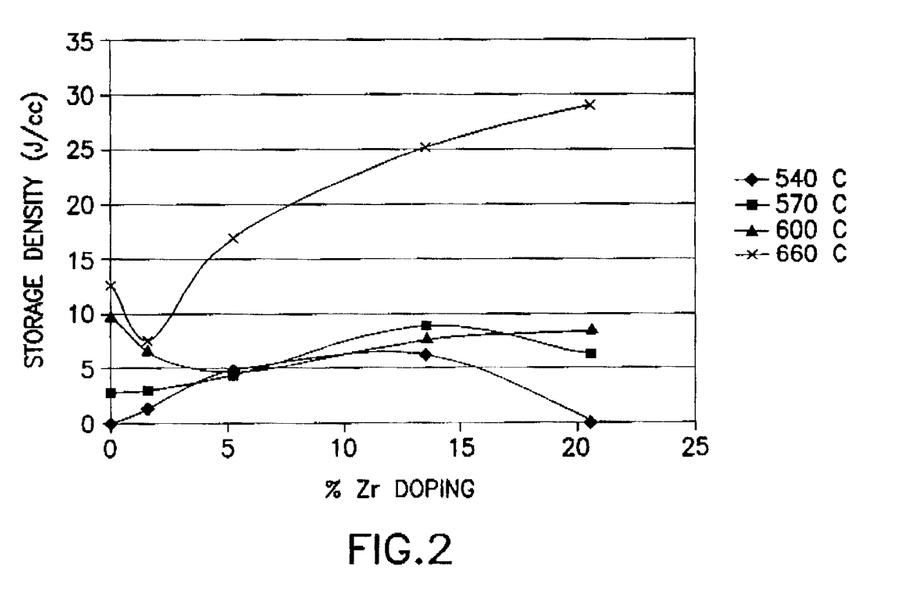
FIG. 2 shows storage density (in J/cc) of Zr-doped BST perovskite crystal thin films (500 Å) deposited at various growth temperatures, plotted as a function of Zr content in such films (in % by total weight of such films).

FIG. 2 shows the volumetric energy storage density (in J/cc) of Zr-doped BST perovskite crystal thin films of the present invention, plotted as a function of Zr content in such films, in weight % of Zr based on the total weight of the film.

High growth temperature is important in achieving energy storage densities above 10 J/cc, as evidenced for example by a Zr-doped BST dielectric thin film deposited at a growth temperature of 660° C., which demonstrates significantly better energy storage performance than corresponding films deposited at lower growth temperatures.

Increased Zr content correspondingly increases the volumetric energy storage density of the resultant Zr-doped BST thin film. For example, a Zr-doped BST thin film deposited at 660° C. can effect an increase in the volumetric energy storage density to values substantially above that of the corresponding undoped film; the undoped film may have a volumetric energy storage density on the order of about 12.5 J/cc, while the corresponding Zr-doped BST thin film has a volumetric energy storage density as high as 30 J/cc or higher. Since energy storage density increases with Zr content, it may be desirable to use films having a Zr content >20% in applications where tunability is not desired.

Another significant advantage of the Zr-doped BST perovskite crystal thin film of the present invention is a significant reduction in leakage current. Generally, leakage current flowing through a dielectric material increases with applied voltage and surrounding temperature. High leakage current is deleterious because it causes the dielectric material to fail as an insulating medium and leads to the previously described catastrophic short-circuiting phenomenon. In addition, high leakage also correlates to high relaxation currents, which lead to increased loss at high frequencies.

Figure 3:
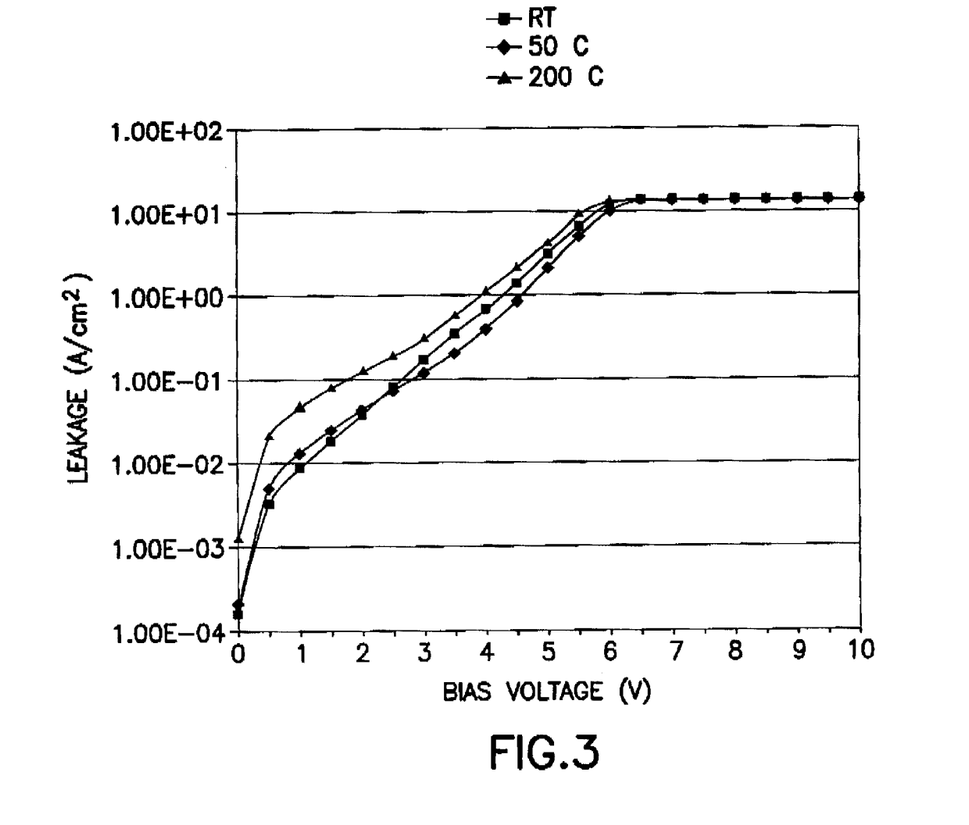
FIG. 3 shows current leakage (in $A/cm^2$) of an undoped BST perovskite crystal thin film (500 Å), deposited at growth temperature of 660° C., plotted as a function of bias voltage (in V) under various temperatures.

FIG. 3 shows, as a comparison example, leakage currents at different operating temperatures for an undoped BST crystal thin film, approximately 500 Å thick and grown at 660° C., plotted as a function of applied voltage. When the applied voltage is as low as 1V (or alternatively −1V), the leakage current of the undoped BST thin film at room temperature (25° C.) is close to 0.01 A/cm$^2$, and the leakage current increases to about 0.06 A/cm$^2$ at an elevated operating temperature of 200° C. When the applied voltage reaches 3V (or alternatively −3V), the leakage current of such undoped BST thin film is as high as 0.1 A/cm$^2$ even at room temperature.

Figure 4:
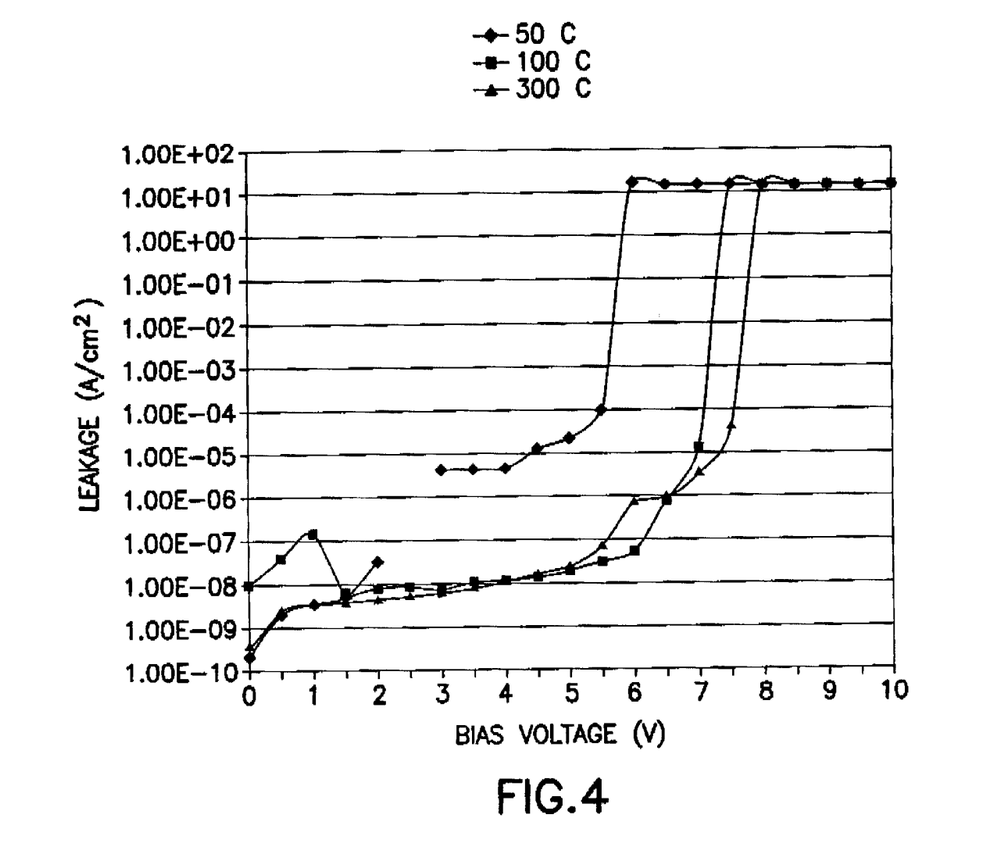
FIG. 4 shows current leakage (in $A/cm^2$) of a Zr-doped BST perovskite crystal thin film (500 Å), deposited at growth temperature of 660° C. and having a Zr content of 4.8% by total weight of such film, plotted as a function of bias voltage (V) under various temperatures.

FIG. 4 shows significantly reduced leakage currents of a Zr-doped BST crystal thin film, approximately 500 Å thick, with a Zr content of 4.8% by weight, based on the total weight of the film, under different operating temperatures. The leakage reduction is especially significant under elevated operating temperatures. Specifically, when the applied voltage is about 3V (or alternatively −3V), the leakage current for such Zr-doped BST crystal thin film is below 1×10$^{-5}$ A/cm$^2$ at 50° C. More importantly, such Zr-doped BST crystal thin film has an even lower leakage under elevated temperatures from about 100° C. to about 300° C. Under such high operating temperatures, the Zr-doped BST crystal thin film of the present invention demonstrates minimal leakage currents of below 1×10$^{-8}$ A/cm$^2$ when the applied voltage is 3V (or alternatively −3V). Moreover, when the applied voltage arises to 5V (or alternatively −5V) under such high temperature, the leakage current of such Zr-doped BST crystal thin film increases by only a minor degree.

Figure 5:
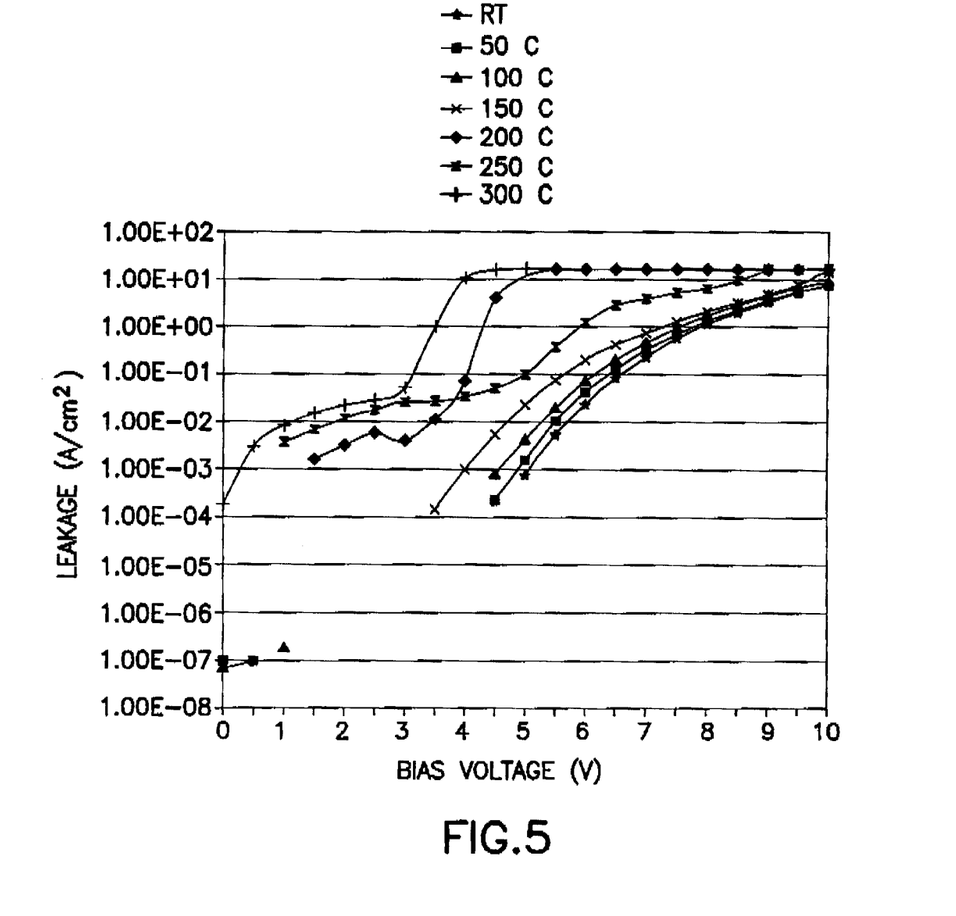
FIG. 5 shows in comparison current leakage (in $A/cm^2$) of a Zr-doped BST perovskite crystal thin film (500 Å), deposited at growth temperature of 660° C. and having a Zr content of 20.65% by total weight of such film, plotted as a function of bias voltage (V) under various temperatures.

FIG. 5 shows leakage data of a Zr-doped BST crystal thin film, approximately 500 Å thick, with a high Zr content of 20.65% by weight, based on the total weight of the film, under different operating temperatures, as a function of applied voltage, in comparison with leakage data of the Zr-doped BST thin film of FIG. 4 of a lower Zr content.

FIG. 5 indicates that films with 20.65% Zr content have leakage higher than that of films with 4.8% Zr content but lower than that of undoped BST films. In fact, there exists an optimal level of Zr doping, from about 4 to about 10% by weight, based on the weight of the film, for the purpose of reducing leakage. Moderate Zr doping levels in such range of about 4 to about 10 wt. % advantageously reduce both room temperature and high temperature leakage current in Zr-doped BST dielectric thin films, evidencing the superior properties of these materials for integrated capacitor applications.

Figure 6:
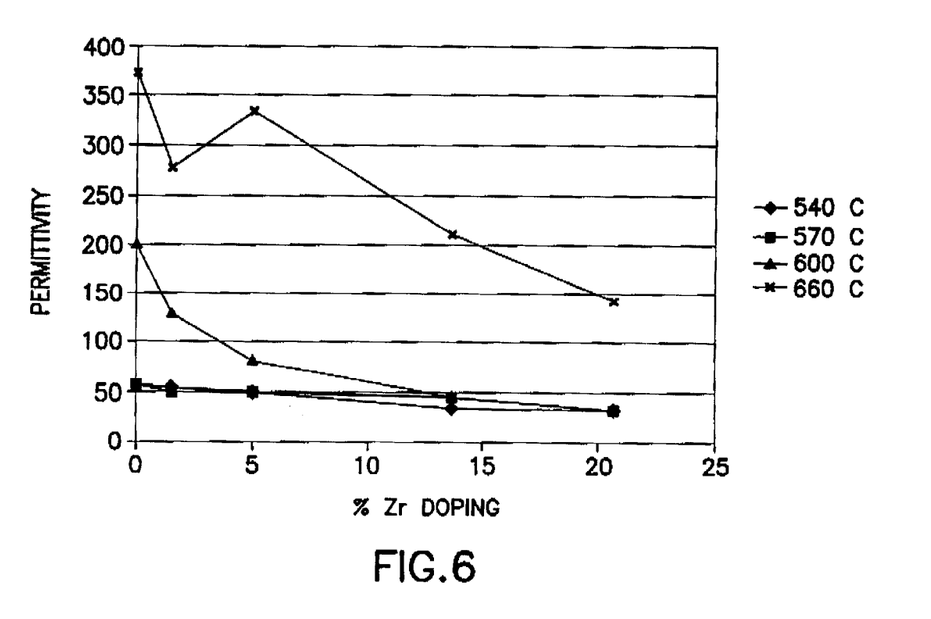
FIG. 6 shows permittivity (as a dimensionless quantity) of Zr-doped BST perovskite crystal thin films (500 Å) deposited at various growth temperatures, plotted as a function of Zr content in such films (in % by total weight of such films).
Figure 7:
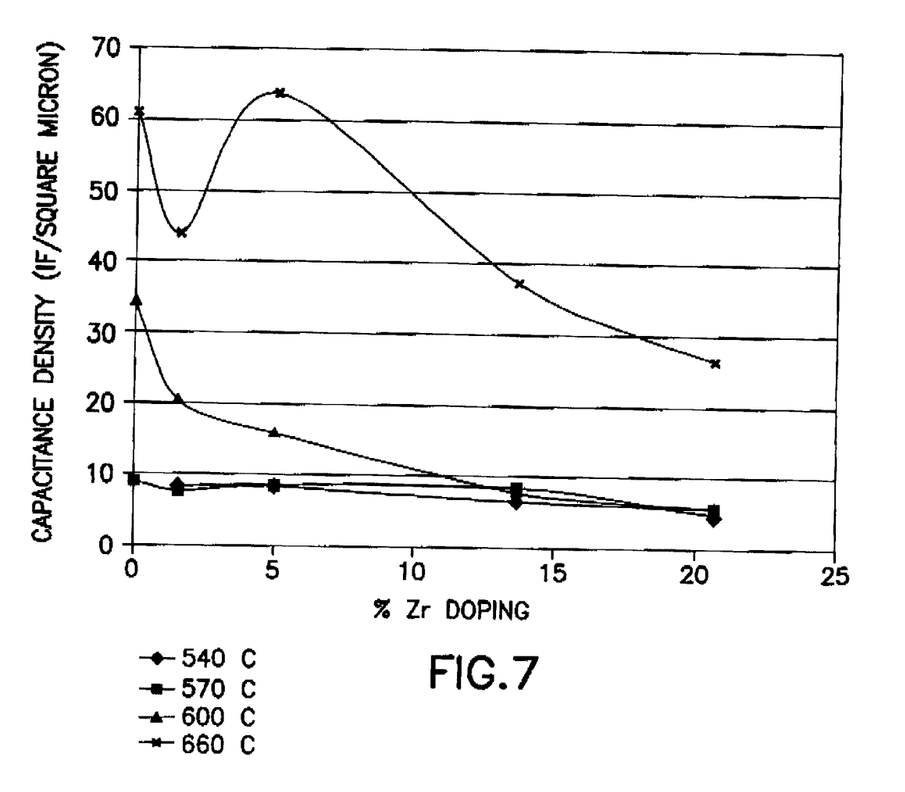
FIG. 7 shows capacitance density (in $fF/\mu m^2$) of Zr-doped BST perovskite crystal thin films (500 Å) deposited at various growth temperatures, plotted as a function of Zr content in such films (in % by total weight of such films).

Permittivity as well as capacitance density of BST crystal thin films are negatively correlated with the Zr doping levels of Zr-doped BST dielectric thin films, as shown by the graphs of FIGS. 6 and 7.

However, permittivity is also affected by crystalline structure of the dielectric thin films, which can be optimized by carrying out the deposition process at high growth temperature, e.g., a temperature in the vicinity of about 660° C. By selecting an optimized growth temperature and a moderate Zr-doping level, as readily determinable by those skilled in the art without undue experimentation, permittivity values of such Zr-doped BST dielectric thin films above 200 are readily achievable, rendering such materials highly advantageous for a wide variety of dielectric applications. More preferably, the permittivity of the Zr-doped dielectric thin film is above 250, and most preferably above 300.

Capacitance density of a dielectric material equals the capacitance density of free space multiplied by dielectric constant k of such material, while permittivity of a dielectric material equals the permittivity of free space multiplied by the dielectric constant k of such material. Therefore, capacitance density of the Zr-doped BST dielectric thin films of the present invention is proportional to the permittivity of such dielectric thin films. This explains the close resemblance between FIG. 6 and FIG. 7. As a result, optimization of the permittivity of Zr-doped BST dielectric thin films by selecting high growth temperature and moderate Zr-doping level will correspondingly optimize capacitance density of such dielectric material.

Figure 8:
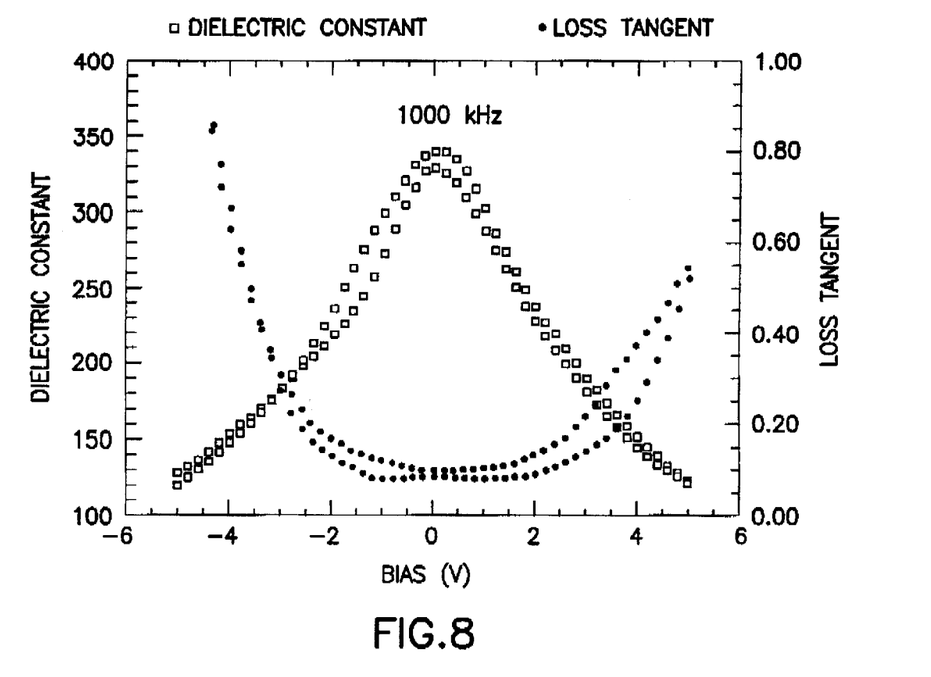
FIG. 8 concurrently shows tunability and loss tangent of an undoped BST perovskite crystal thin film (500 Å) deposited at 660° C. under changing applied voltage (V). Tunability is demonstrated by shifting dielectric constant (at left axis) of such BST thin film plotted as a function of bias voltage varying from −6V to +6V. Loss tangent (at right axis) is also plotted as a function of bias voltage varying from −6V to +6V.

Undoped BST dielectric films have excellent tunability under shifting voltages, as shown by FIG. 8. The dielectric constant of an undoped BST film is below 150 when applied voltage is about ±4V, which rises to above 300 when applied voltage is shifted to 0V. This dielectric constant shift controlled by applied voltage gives a tunability ratio of more than 2:1. However, the loss tangent of such undoped BST films is as high as 0.8 when applied voltage is about ±4V, resulting in tremendous power dissipation, as shown by FIG. 8.

Figure 9:
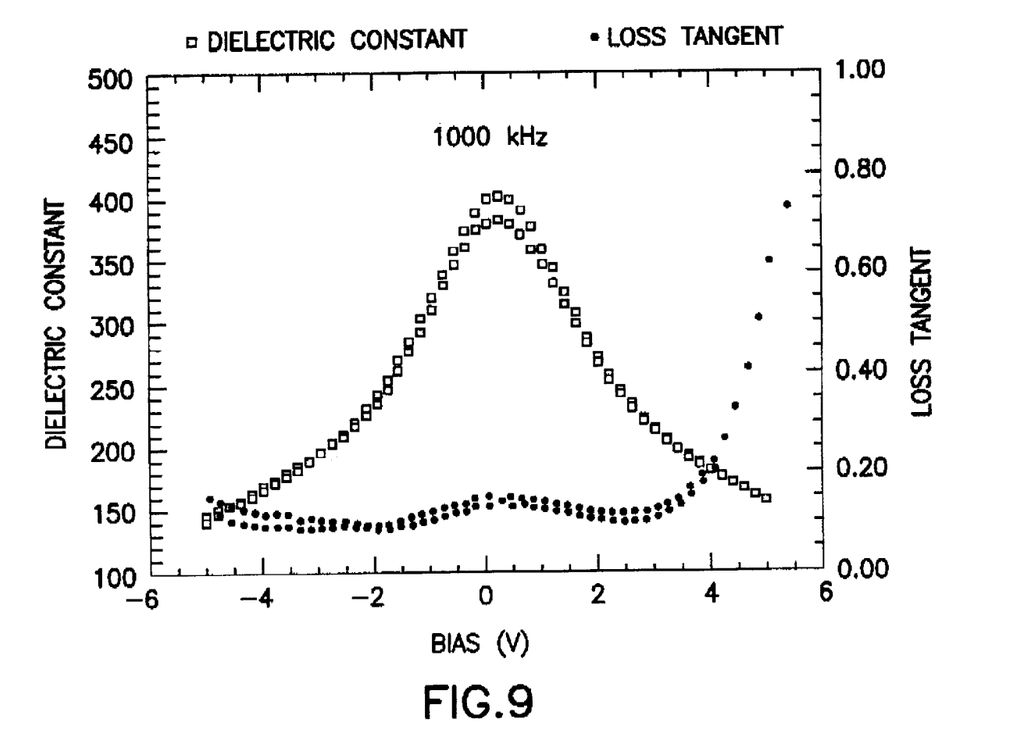
FIG. 9 concurrently shows tunability and loss tangent of a Zr-doped BST perovskite crystal thin film (500 Å), deposited at 660° C. and having a Zr content of 4.8% by total weight of such film, under changing applied voltage (V).

FIG. 9 shows a Zr-doped BST perovskite crystal thin film, approximately 500 Å thick, according to one embodiment of the present invention. Comparison of FIGS. 8 and 9 shows that the Zr-doped BST thin film has an enhanced tunability ratio to about 2.5:1, while the loss tangent of such film is as low as 0.2 when applied voltage is about ±4V.

Figure 10:
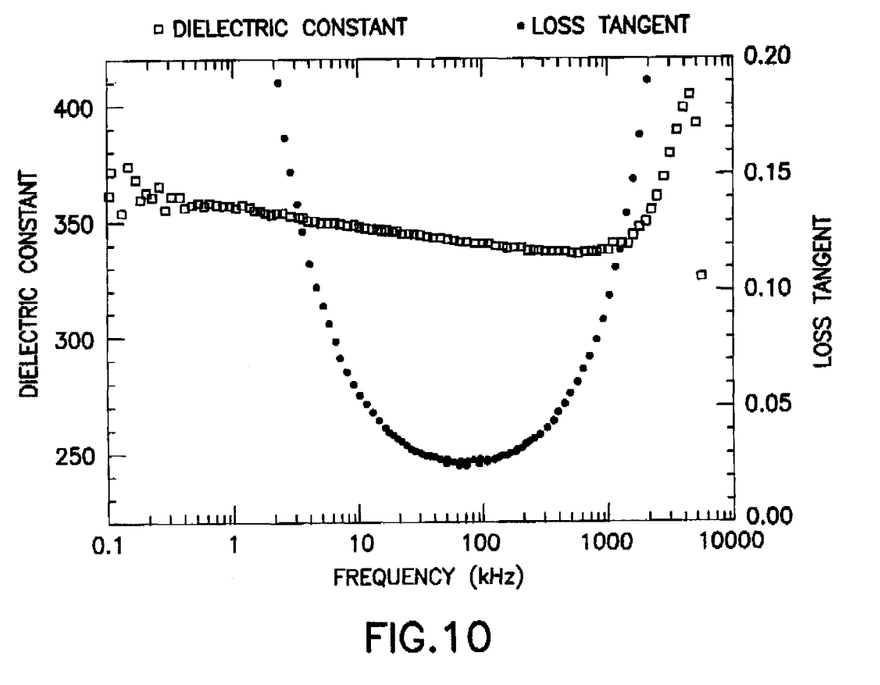
FIG. 10 concurrently shows dielectric constant (at left axis) and loss tangent (at right axis) of an undoped BST perovskite crystal thin film (500 Å) deposited at 660° C., plotted as a function of applied frequency (in kHz) changing from 0.1 kHz to 10000 kHz.
Figure 11:
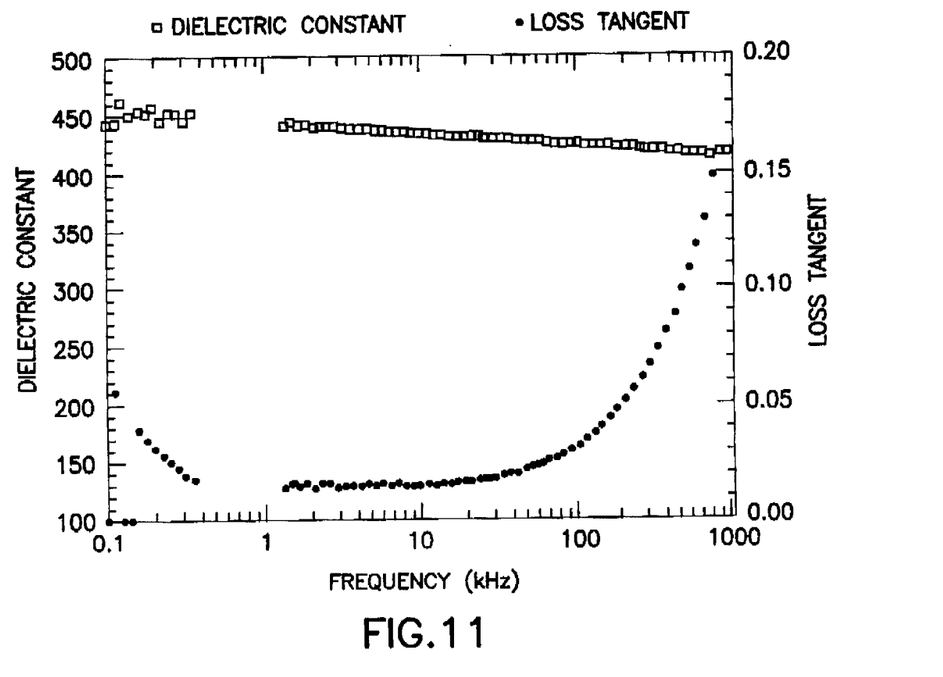
FIG. 11 concurrently shows dielectric constant (at left axis) and loss tangent (at right axis) of a Zr-doped BST perovskite crystal thin film (500 Å), deposited at 660° C. and having a Zr content of 4.8% by total weight of such film, plotted as a function of applied frequency (in kHz) changing from 0.1 kHz to 1000 kHz.

FIGS. 10 and 11 compare dielectric constant and loss tangent data of a Zr-doped BST thin film with those of an undoped BST thin film plotted as a function of frequency. Dielectric constants of both doped and undoped BST films are subject to little influence by frequency changes. However, the Zr-doped BST thin film demonstrates significantly reduced loss tangent compared with that of the undoped BST thin film, when applied frequency is in the range from about 10 kHz to about 100 kHz. Specifically, the Zr-doped BST film has a loss tangent of about 0.02 or less in such frequency range, while the undoped BST film has a loss tangent of 0.03 or higher in such frequency range.

It will be appreciated that the Zr-doped BST perovskite crystal thin film of the present invention has significantly improved dielectric properties, including high breakdown strength, low leakage, high energy storage density, high permittivity, low loss, and high tunability.

The present invention contemplates a commercially useful MOCVD process for fabricating the Zr-doped BST perovskite crystal thin films of the present invention. The process of the present invention is scalable to large areas for Si integration, and provides doped BST thin film materials that are suitable for high-performance microelectronic device applications, as well as microwave phase shifting and tunable varactor applications.

The MOCVD process of the present invention achieves precise compositional control by using a unique, compatible set of precursors as well as optimizing process conditions, to produce the Zr-doped BST perovskite crystal thin film material of the invention.

In accordance with the present invention, metalorganic precursor compositions containing component metals of the desired $(Ba,Sr)(Zr,Ti)O_3$ film are introduced in liquid form, either as neat liquids or dilute solutions in a compatible solvent medium as disclosed hereinabove if the precursor is a solid at ambient temperature and pressure. The solvent medium may also be of any suitable type that is compatible with the specific precursor composition, as is known and understood by those skilled in the art of liquid delivery MOCVD.

The liquid metalorganic precursor compositions then are introduced into a vaporization chamber, either in mixture form or separately. The liquid precursor compositions are flash vaporized at a vaporization temperature in the range from about 100° C. to about 300° C. to produce a corresponding precursor vapor.

The precursor vapor next is transported to a chemical vapor deposition chamber, which may for example comprise a CVD reactor of known or conventional type. The CVD reactor is suitably equipped to introduce the precursor vapor into the deposition chamber for contact therein with a heated substrate at a growth temperature that effects deposition of the metal constituents of the vapor onto the substrate.

For such purpose, the substrate may be mounted on a heated susceptor or other substrate mounting structure, with the spent vapor from the process being discharged from the deposition chamber and subjected to further treatment or processing in a known and conventional manner.

In one embodiment of the present invention, the precursor vapor is carried into the MOCVD deposition chamber with a carrier gas, such as Ar, $N_2$, He, or $NH_4$, where the stream comprising the carrier gas and the precursor vapor is mixed with an oxidizing co-reactant gas, such as $O_2$, $N_2O$, or $O_3$. Preferably, the carrier gas is Ar and the oxidizing co-reactant gas contains both $O_2$ and $N_2O$.

The precursor vapor is decomposed in the deposition chamber to form Zr-doped BST perovskite crystal thin film, e.g., at a growth temperature of 500° C. to 750° C., or at a more narrow temperature range of from 560° C. to 660° C. The growth temperature preferably is sufficiently high (i.e. above 600° C.) to eliminate formation of amorphous or polycrystalline structure, and may desirably be in a range from 600° C. to 660° C. Most preferably, the growth temperature for forming such Zr-doped BST crystal thin film is in the vicinity of about 660° C., minus or plus 20° C., to ensure deposition of a high-quality, single-phase perovskite crystal thin film substantially free from second phase formation.

Metalorganic precursors useful for the present invention include the preferred reagents $Ba(thd)_2$-polyamine, $Sr(thd)_2$-polyamine, $Zr(thd)_4$, and $Ti(OiP'r)_2(thd)_2$. Nonetheless, other types of precursors as listed hereinabove can also be used, and suitable species thereof can be readily determined for particular applications without undue experimentation by those skilled in the art, to achieve a desired product film.

Ti, Ba, and Sr are known to show a linear relationship between input fraction in precursor compositions and fraction incorporated in the resultant deposited BST film. This characteristic may be advantageously exploited for precise compositional control by adjusting ratio of input precursor compositions.

Figure 12:
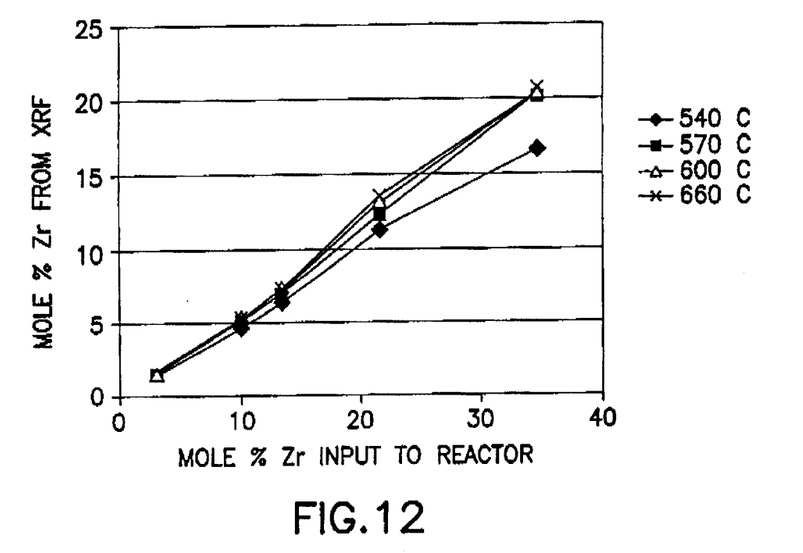
FIG. 12 demonstrates Zr doping efficiency of the MOCVD process of the present invention under various growth temperatures, as a graph of Zr content (in mole %) in deposited Zr-doped BST perovskite crystal thin films (500 Å) as a function of Zr input ratio (in mole %) in mixture of various metal precursor compositions transported into the chemical vapor deposition chamber. Zr content in the deposited Zr-doped BST perovskite crystal thin films is determined by X-ray fluorescence (XRF).

FIG. 12 compares Zr content in deposited Zr-doped BST perovskite crystal thin films with Zr input ratio in mixtures of various metal precursor compositions. FIG. 12 demonstrates that Zr also has a linear relationship between input fraction in the precursor compositions and ultimate Zr content incorporated into the product $(Ba,Sr)(Zr,Ti)O_3$ film. Such incorporation is also independent of growth temperature.

Figure 13:
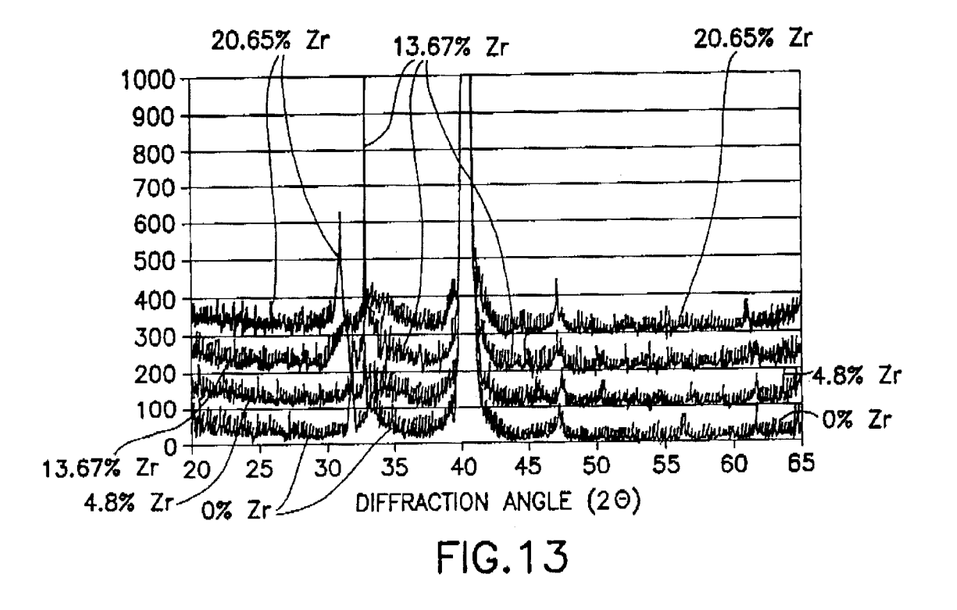
FIG. 13 shows X-ray diffraction (XRD) patterns for various BST perovskite crystal thin films (500 Å) with various Zr contents (in weight % by total weight of such thin films) deposited at growth temperature of 660° C.

FIG. 13 shows the physical effects of incorporation of Zr into the BST lattice, using X-ray diffraction (XRD). D-spacing of the $(Ba,Sr)(Zr,Ti)O_3$ thin film material increases with Zr content, because Zr has a larger atomic radius than Ti and is substituting in the Ti position of the lattice and expanding the lattice slightly. FIG. 13 shows a shift of XRD peaks to lower 2θ angles, also due to increased lattice parameter, but no sign of secondary phases is observed.

Thus, while the invention has been disclosed herein with respect to illustrative examples, features and embodiments, it will be appreciated that the utility of the invention is not limited thereby, but rather extends to and encompasses a variety of variations, modifications and other embodiments, which therefore are contemplated as being within the spirit and scope of the invention as hereinafter claimed.

What is claimed is:

1. A dielectric thin film having an energy storage density of at least 15 J/cc, said thin film comprising $(Ba,Sr)(Ti,Zr)O_3$, perovskite crystal material, wherein Zr is present in an amount of from about 20% to about 50% by total weight of said dielectric thin film.

2. A dielectric thin film according to claim 1, wherein said dielectric thin film has a thickness in the range from about 150 Å to about 10,000 Å.

3. A dielectric thin film according to claim 1, wherein said dielectric thin film has a thickness in the range from about 150 Å to about 5000 Å.

4. A dielectric thin film according to claim 1, wherein said dielectric thin film has a thickness in the range from about 150 Å to about 2500 Å.

5. A dielectric thin film according to claim 1 wherein said dielectric thin film has a thickness in the range from about 150 Å to about 1000 Å.

6. A dielectric thin film according to claim 1, wherein said dielectric thin film has a thickness in the range from about 300 Å to about 700 Å.

7. A dielectric thin film according to claim 1, wherein said dielectric thin film has a thickness of about 400 to about 600 Å.

8. A dielectric thin film according to claim 1, wherein said dielectric thin film is deposited by a metalorganic chemical vapor deposition process.

9. A dielectric thin film according to claim 8, wherein said dielectric thin film is deposited at temperature in the range from about 500° C. to about 750° C.

10. A dielectric thin film according to claim 8, wherein said dielectric thin film is deposited at temperature in the range from about 560° C. to about 700° C.

11. A dielectric thin film according to claim 8, wherein said dielectric thin film is deposited at temperature in the range from about 600° C. to about 660° C.

12. A dielectric thin film according to claim 8, wherein said dielectric thin film is deposited at temperature above about 600° C.

13. A dielectric thin film according to claim 8, wherein said dielectric thin film is deposited at temperature of about 660° C.±20° C.

14. A dielectric thin film according to claim 8, wherein said dielectric thin film is deposited at a pressure in the range from about 700 millitorr to about 750 millitorr.

15. A dielectric thin film according to claim 8, wherein said dielectric thin film is deposited using metal precursors comprising at least one metal coordination complex including at least one ligand selected from the group consisting of: β-diketonates, β-ketoiminates, β-diiminates, $C_1$–$C_8$ alkyl, $C_2$–$C_{10}$ alkenyl, $C_2$–$C_{15}$ cycloalkenyl, $C_6$–$C_{10}$ aryl, $C_1$–$C_8$ alkoxy, and fluorinated derivatives thereof.

16. A dielectric thin film according to claim 8, wherein said dielectric thin film is deposited using strontium metal precursors comprising Sr bis(thd) coordinated with Lewis base selected from the group consisting of alkene, diene, cycloalkene, cyclooctatetraene, alkyne, substituted alkyne (symmetrical or asymmetrical), amine, diamine, triamine, tetraamine, polyamine, ether, diglyme, triglyme, tetraglyme, tetramethyl, dialkyl sulfide, ethylenediamine, vinyltrimethylsilane, allyltrimethylsilane, and pentaamethyl diethylenetriamine.

17. A dielectric thin film according to claim 8, wherein said dielectric thin film is deposited using barium metal precursors comprising Ba bis(thd) coordinated with Lewis base selected from the group consisting of alkene, diene, cycloalkene, cyclooctatetraene, alkyne, substituted alkyne (symmetrical or asymmetrical), amine, diamine, triamine, tetraamine, polyamine, ether, diglyme, triglyme, tetraglyme, tetramethyl, dialkyl sulfide, ethylenediamine, vinyltrimethylsilane, allyltrimethylsilane, and pentaamethyl diethylenetriamine.

18. A dielectric thin film according to claim 8, wherein said dielectric thin film is deposited using zirconium metal precursors selected from the group consisting of $Zr(thd)_4$, $Zr(OiPr)_2(thd)_2$, $Zr(OtBu)_2(thd)_2$, and combinations thereof.

19. A dielectric thin film according to claim 8, wherein said dielectric thin film is deposited using titanium metal precursors selected from the group consisting of $Ti(thd)_4$, $Ti(OiPr)_2(thd)_2$, $Ti(OtBu)_2(thd)_2$, and combinations thereof.

20. A dielectric thin film according to claim 8, wherein said dielectric thin film is deposited using metal precursors comprising $Ba(thd)_2$-polyamine, $Sr(thd)_2$-polyamine, $Zr(thd)_4$, and $Ti(OiPr)_2(thd)_2$.

21. A dielectric thin film according to claim 8, wherein said dielectric thin film is deposited at a deposition rate in the range of from about 10 Å/min to about 60 Å/min.

22. A dielectric thin film according to claim 8, wherein said dielectric thin film is deposited by a digital MOCVD process.

23. A dielectric thin film according to claim 1, having a breakdown strength of at least 1.5 MV/cm.

24. A dielectric thin film according to claim 1, having a leakage current of at least $1 \times 10^{-4}$ $A/cm^2$ under applied voltage of about ±3V or above and at temperature of about 100° C. or above.

25. A dielectric thin film according to claim 1, having a leakage current of not more than $1 \times 10^{-5}$ $A/cm^2$ under applied voltage of about ±3V or above and at temperature of about 100° C. or above.

26. A dielectric thin film according to claim 1, having an energy storage density of at least 20 J/cc.

27. A dielectric thin film according to claim 1, having an energy storage density of at least 25 J/cc.

28. A dielectric thin film according to claim 1, further characterized by a permittivity of at least 200.

29. A dielectric thin film according to claim 1, further characterized by a permittivity of at least 250.

30. A dielectric thin film according to claim 1, further characterized by a permittivity of at least 300.

31. A dielectric thin film according to claim 1, further characterized by a loss tangent of not more than 0.2 under applied voltage in the range from about −4V to about +4V.

32. A dielectric thin film according to claim 1, further characterized by a loss tangent of not more than 0.02 under applied frequency in the range from about 10 kHz to about 100 kHz.

33. A dielectric thin film according to claim 1, further characterized by a tunability ratio of not less than 2.5 under voltage shift from ±5V to 0V.

34. A dielectric thin film according to claim 1, comprising single phase $(Ba,Sr)(Ti,Zr)O_3$ perovskite crystal material.

35. A dielectric thin film according to claim 34, wherein said single phase $(Ba,Sr)(Ti,Zr)O_3$ perovskite crystal material is substantially free of second phase formation.

* * * * *